(12) United States Patent
Okamura et al.

(10) Patent No.: US 12,035,634 B2
(45) Date of Patent: Jul. 9, 2024

(54) TUNNELING MAGNETORESISTIVE (TMR) DEVICE WITH IMPROVED SEED LAYER

(71) Applicant: Western Digital Technologies, Inc., San Jose, CA (US)

(72) Inventors: Susumu Okamura, San Jose, CA (US); Christian Kaiser, San Jose, CA (US); Brian R. York, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 406 days.

(21) Appl. No.: 17/472,019

(22) Filed: Sep. 10, 2021

(65) Prior Publication Data

US 2023/0084970 A1    Mar. 16, 2023

(51) Int. Cl.
*H10N 50/10* (2023.01)
*H10B 61/00* (2023.01)
*H10N 50/80* (2023.01)
*H10N 50/85* (2023.01)

(52) U.S. Cl.
CPC ............. *H10N 50/10* (2023.02); *H10B 61/20* (2023.02); *H10N 50/80* (2023.02); *H10N 50/85* (2023.02)

(58) Field of Classification Search
CPC ............................... H10N 50/10; H10N 50/85
See application file for complete search history.

(56) References Cited

U.S. PATENT DOCUMENTS

| | | | |
|---|---|---|---|
| 6,846,543 B2 | 1/2005 | Bian et al. | |
| 6,872,478 B2 | 3/2005 | Bian et al. | |
| 7,035,062 B1 | 4/2006 | Mao | |
| 7,859,034 B2 | 12/2010 | Huai et al. | |
| 8,670,217 B1 | 3/2014 | Braganca et al. | |
| 9,099,124 B1* | 8/2015 | Freitag | G01R 33/098 |
| 2006/0218773 A1* | 10/2006 | Carey | B82Y 10/00 |
| | | | 29/603.12 |
| 2007/0015293 A1* | 1/2007 | Wang | B82Y 40/00 |
| | | | 257/E43.006 |
| 2007/0111332 A1* | 5/2007 | Zhao | G11B 5/3909 |
| | | | 438/795 |
| 2007/0195592 A1 | 8/2007 | Yuasa | |
| 2009/0257151 A1* | 10/2009 | Zhang | G01R 33/1284 |
| | | | 427/127 |
| 2012/0299132 A1 | 11/2012 | Lin | |

(Continued)

FOREIGN PATENT DOCUMENTS

KR       20130008929 A       1/2013

OTHER PUBLICATIONS

International Search Report and Written Opinion for International Application No. PCT/US2022/028238 dated Sep. 21, 2022.

*Primary Examiner* — Vincent Wall
(74) *Attorney, Agent, or Firm* — PATTERSON + SHERIDAN, LLP

(57) ABSTRACT

A tunneling magnetoresistance (TMR) device has an improved seed layer for the lower or first ferromagnetic layer that eliminates the need for boron in the two ferromagnetic layers. The seed layer, for example a RuAl alloy, has a B2 crystalline structure with (001) texture when deposited on an amorphous pre-seed layer, meaning that the (001) plane is parallel to the surface of the TMR device substrate. The subsequently deposited first ferromagnetic layer, like a CoFe alloy, and the tunneling barrier layer, typically MgO, inherit the (001) texture of the seed layer.

21 Claims, 6 Drawing Sheets

(56) References Cited

U.S. PATENT DOCUMENTS

| | | | |
|---|---|---|---|
| 2013/0015539 A1* | 1/2013 | Choi | H10N 50/10 |
| | | | 257/E29.323 |
| 2013/0107616 A1* | 5/2013 | Ohno | H01L 29/82 |
| | | | 365/158 |
| 2017/0213957 A1* | 7/2017 | Hong | G11C 11/161 |
| 2018/0138397 A1 | 5/2018 | Lee et al. | |

* cited by examiner

TUNNELING MAGNETORESISTIVE (TMR) DEVICE WITH IMPROVED SEED LAYER

BACKGROUND

Field of the Invention

The invention relates generally to tunneling magnetoresistance (TMR) devices, and more particularly to a TMR device with a seed layer that improves formation of the tunneling barrier layer and performance of the TMR device.

Description of the Related Art

A tunneling magnetoresistance (TMR) device, also called a magnetic tunneling junction (MTJ) device, is comprised of two ferromagnetic layers separated by a thin insulating tunneling barrier layer. The barrier layer is typically made of a metallic oxide that is so sufficiently thin that quantum-mechanical tunneling of charge carriers occurs between the two ferromagnetic layers. While various metallic oxides, such as ZnO, MnO, CoO, TiO and VO, have been proposed as the tunneling barrier material, the most common material is crystalline magnesium oxide (MgO). The quantum-mechanical tunneling process is electron spin dependent, which means that an electrical resistance measured when applying a sense current across the junction depends on the spin-dependent electronic properties of the ferromagnetic and barrier layers and is a function of the relative orientation of the magnetizations of the two ferromagnetic layers.

In one type of TMR or MTJ device, called a pinned-type, the magnetization of one of the ferromagnetic layers, called the reference layer, is fixed or pinned, while the magnetization of the other ferromagnetic layer, called the free layer, is free to rotate in response to external magnetic fields. Pinned-type TMR devices are usable in magnetic recording read heads, where the free ferromagnetic layer's magnetization rotates relative to the reference ferromagnetic layer's magnetization in the presence of a magnetic field from the recorded magnetic media. Pinned-type TMR devices are also usable in magnetic random access memory (MRAM) (e.g., spin transfer torque MRAM (STT-MRAM) and spin orbit torque MRAM (SOT-MRAM)) devices that use MTJs as memory storage bits or cells, where the magnetization of the free layer relative to the reference layer in the MTJ is changed directly with an electrical current. A TMR device can also be used as part of a magnetic sensor device usable in a variety of applications (e.g., industrial, automotive, medical).

In another type of TMR device, called a dual free layer (DFL) type, there are two free ferromagnetic layers in which the magnetizations of both ferromagnetic layers are free to rotate relative to one another in a "scissoring" effect in response to an external magnetic field. DFL read heads for magnetic recording devices are described in U.S. Pat. No. 7,035,062 B2 and U.S. Pat. No. 8,670,217 B1.

SUMMARY

TMR devices with MgO tunneling barrier layers, like CoFe/MgO/CoFe tunnel junctions, exhibit a very large tunneling magnetoresistance (TMR) due to coherent tunneling of the electrons of certain symmetry. However, the ferromagnetic layers and MgO barrier layer are required to have perfect crystallinity to achieve the high TMR. The ferromagnetic layers and MgO barrier layer are typically formed by sputter deposition and subsequent annealing, which forms the crystalline structure. CoFe/MgO/CoFe tunnel junctions that exhibit the required low resistance-area product (RA) do not exhibit high TMR, likely due to inferior crystallinity of the MgO barrier layer. However, it has been found that when boron (B) is used in one or more of the ferromagnetic layers, such as using a thin amorphous CoFeB or CoFeBTa layer in a multilayer structure, higher TMR is observed after annealing. The amorphous CoFeB layer promotes better growth of the MgO with (001) texture (the surface plane parallel to the surface of the substrate), and thus higher TMR.

Advanced TMR devices with even higher TMR will require a reduction in the resistance-area product (RA), which means that the MgO barrier layers will need to be made thinner. However, as the MgO thickness decreases the breakdown voltage and TMR also decrease, which is believed due, in part, to diffusion of boron into the MgO barrier layer. What is needed is a TMR device with a thin MgO barrier layer and thus reduced RA, but with high TMR.

Embodiments of this invention relate to a TMR device with an improved seed layer for the lower or first ferromagnetic layer that eliminates the need for boron in the ferromagnetic layers. The seed layer, for example a RuAl alloy, has a B2 crystalline structure (also called a CsCl crystalline structure) with (001) texture, meaning that the (001) plane is parallel to the surface of the TMR device substrate. The subsequently deposited first ferromagnetic layer, like a CoFe alloy, and the tunneling barrier layer, typically MgO, also inherit the (001) texture of the seed layer. After deposition of the second ferromagnetic layer and annealing, the crystallization of the ferromagnetic layers and tunnel barrier layer is improved, due to the absence of diffused boron and the larger grain size of the boron-free ferromagnetic layers, which reduces defects at the grain boundaries. The resulting TMR device has reduced RA and increased TMR over the prior art boron-containing TMR device.

For a fuller understanding of the nature and advantages of the present invention, reference should be made to the following detailed description taken together with the accompanying figures.

DETAILED DESCRIPTION

Figure 1:
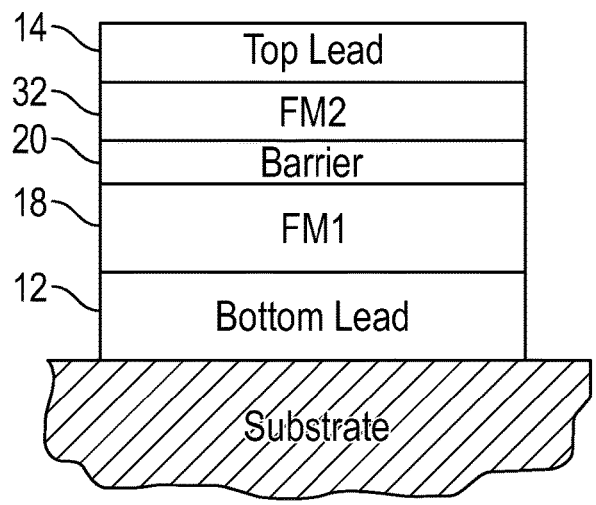
FIG. 1 is a cross-sectional view illustrating the structure of two types of conventional tunneling magnetoresistance (TMR) devices.

FIG. 1 illustrates a cross-sectional view of two types of TMR read head 10. The TMR read head includes a bottom ferromagnetic (FM1) layer 18, an insulating tunneling barrier layer 20, and a top ferromagnetic (FM2) layer 32. The TMR read head has bottom and top nonmagnetic electrodes or leads 12, 14, respectively, with the bottom nonmagnetic electrode 12 being formed on a suitable substrate. A seed layer (not shown) can be located between the bottom lead and FM1, and a cap layer (not shown) can be located between FM2 and the top lead). In a DFL read head, both FM1 and FM2 are "free" ferromagnetic layers because their magnetizations are free to rotate relative to one another with a scissoring effect in the presence of an external magnetic field from the recorded magnetic media.

Figure 2:
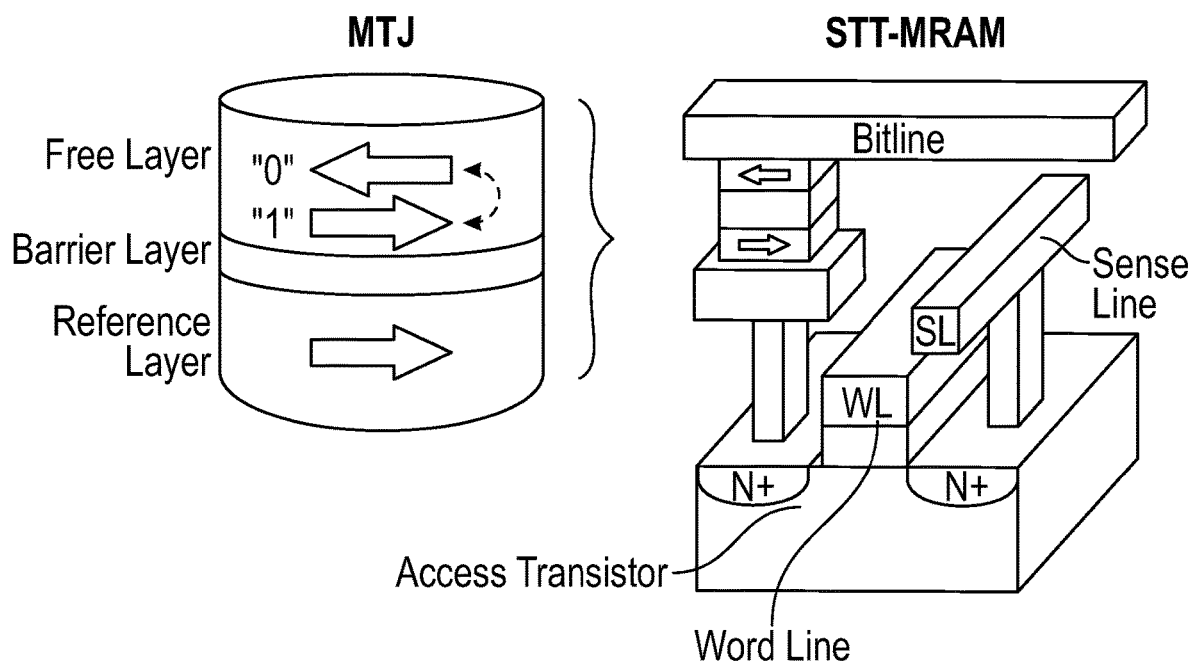
FIG. 2 is perspective view of a magnetic tunnel junction (MTJ) as a memory cell in a spin transfer torque magnetic random access memory (STT-MRAM) device.

In a pinned-type TMR device either FM1 or FM2 has its magnetization fixed or pinned while the other ferromagnetic layer has its magnetization free to rotate in the presence of an external magnetic field. The pinned ferromagnetic layer is called the reference layer because its magnetization is prevented from rotation. The magnetization of the reference layer can be fixed or pinned by being formed of a high-coercivity film or by being exchange-coupled to an antiferromagnetic (AF) "pinning" layer. The pinned-type TMR device can be used as memory cells in a STT-MRAM device, as shown in FIG. 2. A single MTJ is depicted in the STT-MRAM device. The orientation of the magnetization of the free ferromagnetic layer can be modified using a spin-polarized current to have an orientation either parallel or antiparallel to the fixed magnetization of the reference layer, thereby generating two resistance levels representing a 1 (parallel) or 0 (antiparallel) as a bit in the MTJ cell. The MTJ can similarly be used in an SOT-MRAM device, which primarily differs from the STT-MRAM in how writing is achieved through the SOT effect instead of the STT effect. As noted above, besides read head and magnetic memory applications, a TMR device can also be part of a sensor device.

Figure 3:
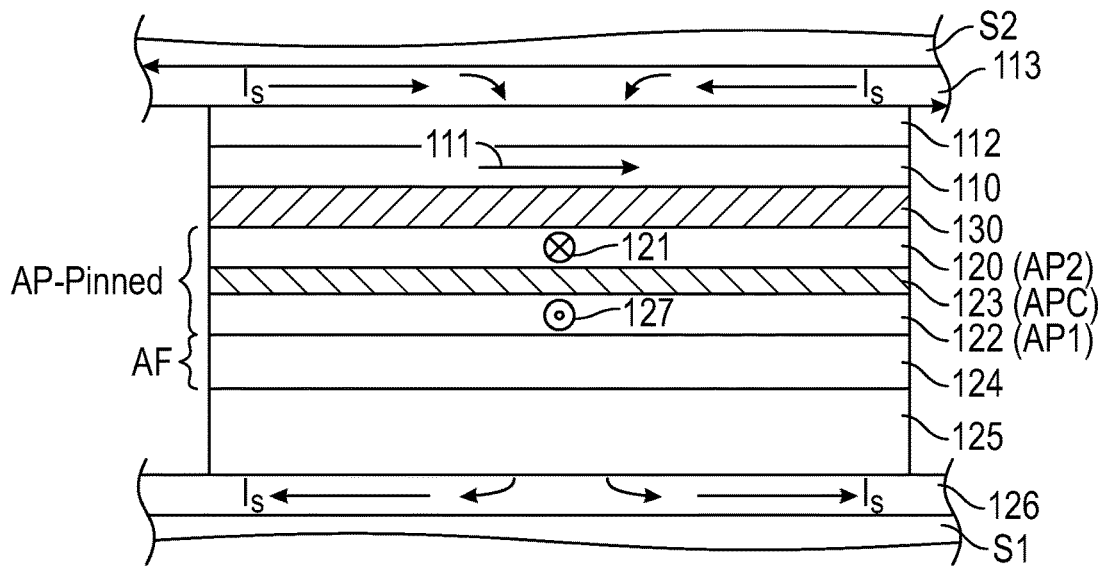
FIG. 3 is a cross-sectional view illustrating the detailed structure of a prior-art pinned-type TMR read head.

The pinned-type TMR device may also be used as a read head in magnetic recording devices, like a hard disk drive, as shown in more detail in FIG. 3. FIG. 3 is a cross-sectional highly schematic view illustrating the structure of a prior-art pinned-type TMR read head like that used in a magnetic recording hard disk drive. This cross-sectional view is a view of what is commonly referred to as the gas-bearing surface (GBS) of the TMR read head. The TMR read head includes a sensor stack of layers formed between two ferromagnetic shield layers S1, S2 that are typically made of electroplated NiFe alloy films. The sensor stack includes a ferromagnetic reference layer 120 having a pinned magnetization 121 oriented transversely (away from the page), a ferromagnetic free layer 110 having a magnetization 111 that can rotate in the plane of layer 110 in response to transverse external magnetic fields from a recording disk, and an electrically insulating tunneling barrier layer 130, typically magnesium oxide (MgO), between the ferromagnetic reference layer 120 and ferromagnetic free layer 110.

The reference layer 120 may be a conventional "simple" or single pinned layer that has its magnetization direction 121 pinned or fixed, typically by being exchange coupled to an antiferromagnetic layer. However, in the example of FIG. 3, the reference layer 120 is part of the well-known antiparallel (AP) pinned or flux-closure structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower pinned ferromagnetic (AP1) layer 122 that are antiferromagnetically coupled across an AP coupling (APC) layer 123, such as Ru, Ir, Rh, or Cr, or alloys thereof. Due to the antiparallel coupling across the APC layer 123, the reference (AP2) and pinned (AP1) ferromagnetic layers 120, 122 have their respective magnetizations 121, 127 oriented antiparallel to each other. As a result, the net magnetization of the AP2 and AP1 ferromagnetic layers 120, 122 is so small that a demagnetizing field induced by the flux closure structure in the ferromagnetic free layer 110 is substantially minimized, and thus it becomes feasible for the TMR read head to operate optimally.

Located between the substrate, lower shield layer S1, and the AP-pinned structure are seed layer 125 and an antiferromagnetic (AF) pinning layer 124. The seed layer 125 facilitates the AF pinning layer 124 to grow a microstructure with a strong crystalline texture and thus develop strong antiferromagnetism. The AF pinning layer 124 thus strongly exchange-couples to the ferromagnetic pinned layer 122, and thereby rigidly pins the magnetization 127 of the ferromagnetic pinned layer 122 in a direction perpendicular to and away from the GBS. The antiparallel coupling across the APC layer 123 then subsequently rigidly pins the magnetization 121 of the ferromagnetic reference layer 120 in a direction perpendicular to and towards the ABS, and antiparallel to magnetization 127. As a result, the net magnetization of the ferromagnetic AP2 and AP1 layers 120, 122 is rigidly pinned, and thus the optimal operation of the TMR read head is ensured.

Located between the ferromagnetic free layer 110 and the upper shield layer S2 is a layer 112, sometimes called a capping or cap layer. The layer 112 protects the ferromagnetic free layer 110 from chemical and mechanical damages during processing, so that ferromagnetic free layer 110 maintains good ferromagnetic properties.

In the presence of external magnetic fields in the range of interest, i.e., magnetic fields from written data on the recording disk, while the net magnetization of the ferromagnetic layers 120, 122 remains rigidly pinned, the magnetization 111 of the ferromagnetic free layer 110 will rotate in responses to the magnetic fields. Thus, when a sense current Is flows from the upper shield layer S2 perpendicularly through the sensor stack to the lower shield layer S1, the magnetization rotation of the ferromagnetic free layer 111 will lead to the variation of the angle between the magnetizations of the ferromagnetic reference layer 120 and the ferromagnetic free layer 110, which is detectable as the change in electrical resistance. Because the sense current is directed perpendicularly through the stack of layers between the two shields S1 and S2, the TMR read head is a current-perpendicular-to-the-plane (CPP) read head.

FIG. 3 also shows optional separate electrical leads 126, 113 between shields S1, S2, respectively, and the sensor stack. The leads are optional and may be used to adjust the shield-to-shield spacing. If the leads 126 and 113 are not present, the bottom and top shields S1 and S2 are used as electrical leads. While the TMR read head shown in FIG. 3 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the barrier layer 130.

MgO tunnel junctions are required to have (001) texture and perfect crystallinity. The MgO barrier layer is typically deposited as a NaCl (rock salt) crystalline structure with (001) texture on an amorphous layer by sputter deposition, and the subsequent annealing improves the crystalline structure by removing strain. It has been found that the use of a thin amorphous CoFeB or CoFeBTa layer in one or both ferromagnetic layers results in higher TMR or TMR ratio (ΔR/R). The as-deposited amorphous CoFeB layer is known to promote the (001) textured MgO and higher TMR with CoFeB crystallization to (001) texture after annealing.

Figure 4:
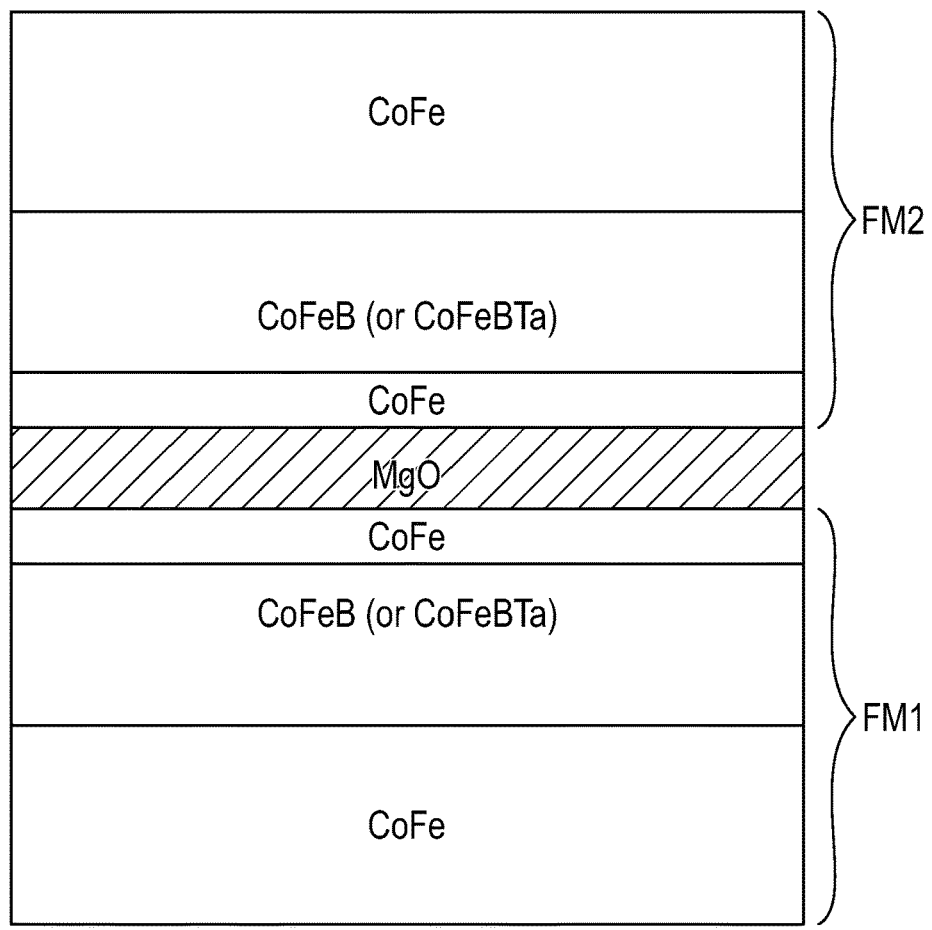
FIG. 4 is a schematic illustrating a typical FM1-layer/MgO/FM2-layer structure with boron present in both ferromagnetic (FM) layers.

FIG. 4 is a schematic cross-sectional view of a typical FM1-layer/MgO/FM2-layer structure with boron present in both ferromagnetic layers. FM1 and FM2 can both be free layers in a DFL device or one of FM1 and FM2 can be a reference layer in a pinned-type device. Each of the reference and free ferromagnetic layers is depicted as a thin (e.g., between about 1-4 Å thick) CoFe "nanolayer" adjacent the MgO barrier layer, a CoFe layer and a CoFeB (and in some instances CoHf, CoFeBTa, or other amorphous insertion layer) layer between the nanolayer and the CoFe layer. The CoFeB layer has a typical composition of $(Co_xFe_{(100-x)})_{(100-y)}B_y$, where the subscripts represent atomic percent, x is between about 40 and 100, and y is between about 10 and 20. The total thickness of each of the FM1 and FM2 ferromagnetic layers is typically between about 20 and 80 Å. Other materials are well known for use in the ferromagnetic layers, such as Co or Fe nanolayers, NiFe alloys and Heusler alloys.

However, it has been discovered that in the prior art TMR device of FIG. 4 boron diffuses into the MgO barrier layer during annealing, which decreases the breakdown voltage and TMR. Also, for advanced TMR devices the MgO needs to be made thinner to reduce the resistance-area product (RA). Thinner MgO barrier layers would be even more susceptible to boron diffusion. Also, the smaller grains of the MgO deposited on the CoFeB means that there can be more defects in the MgO grain boundaries after annealing.

Figure 5:
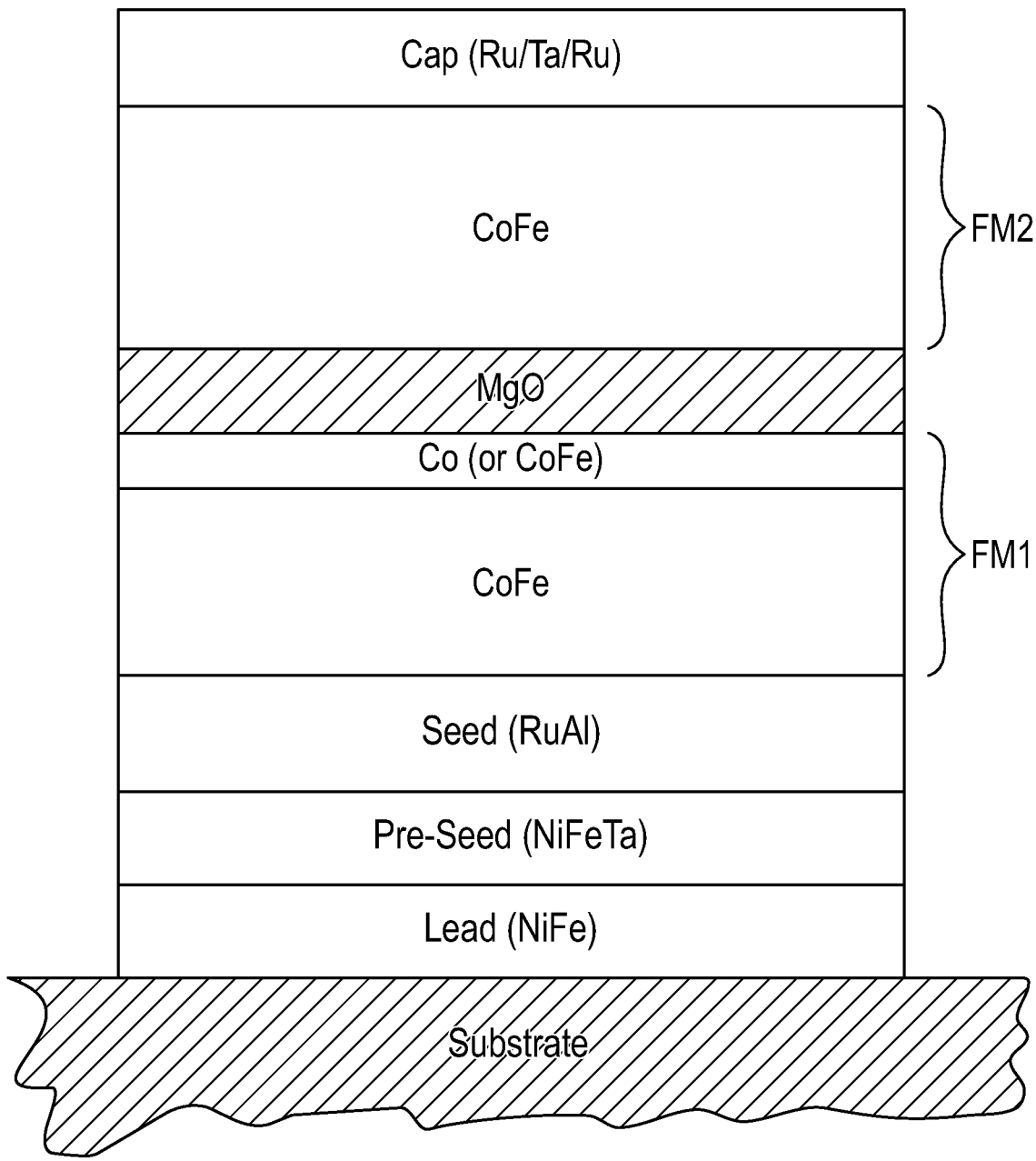
FIG. 5 is a schematic cross-sectional view of a FM1-layer/MgO/FM2-layer structure according to an embodiment of the invention with an improved seed layer and boron-free FM1 and FM2 layers.
Figure 6A:
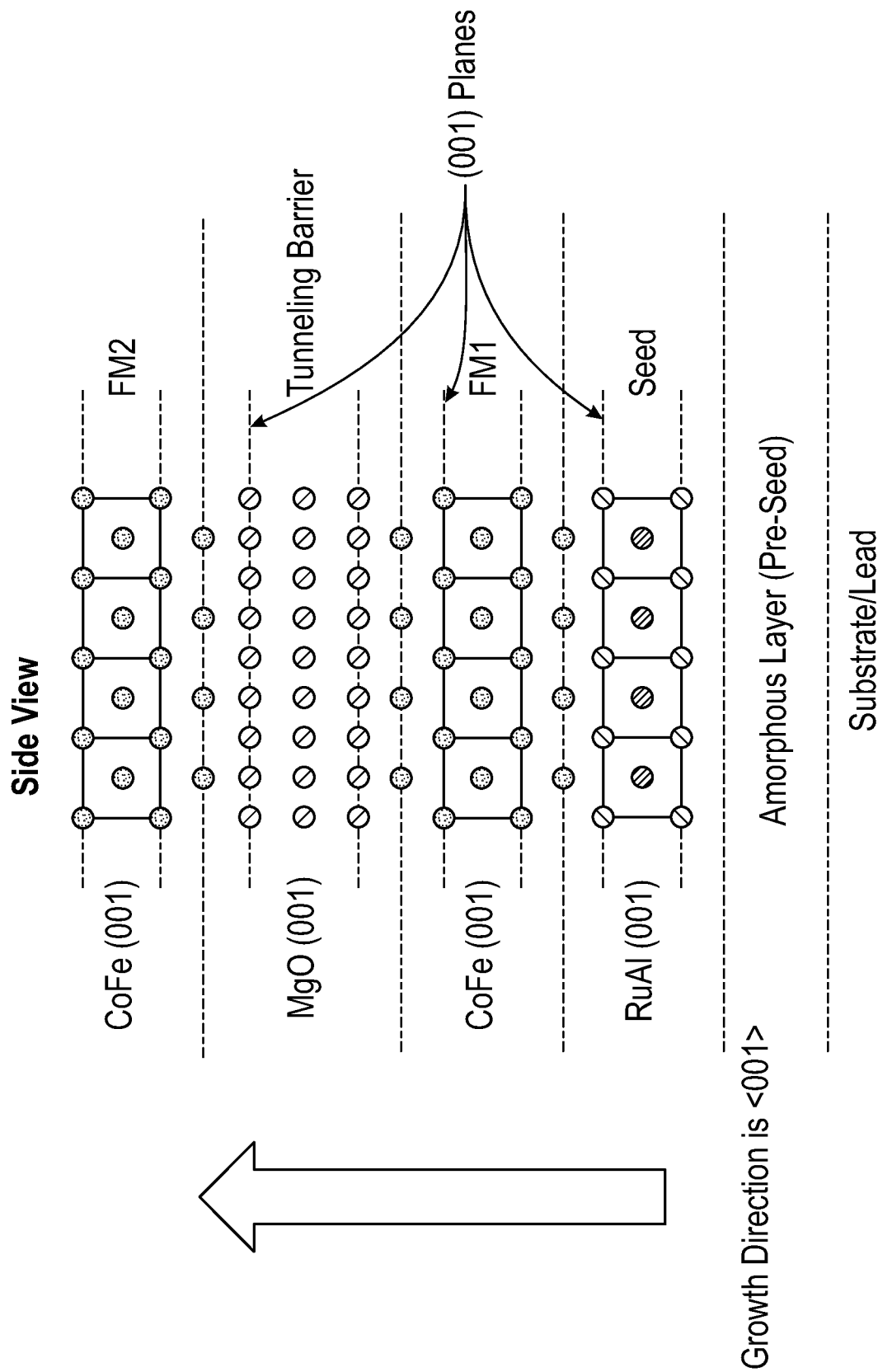
FIG. 6A is a schematic of a side view showing the growth of the FM1 and tunneling barrier layer with (001) texture on the B2 structure seed layer.
Figure 6B:
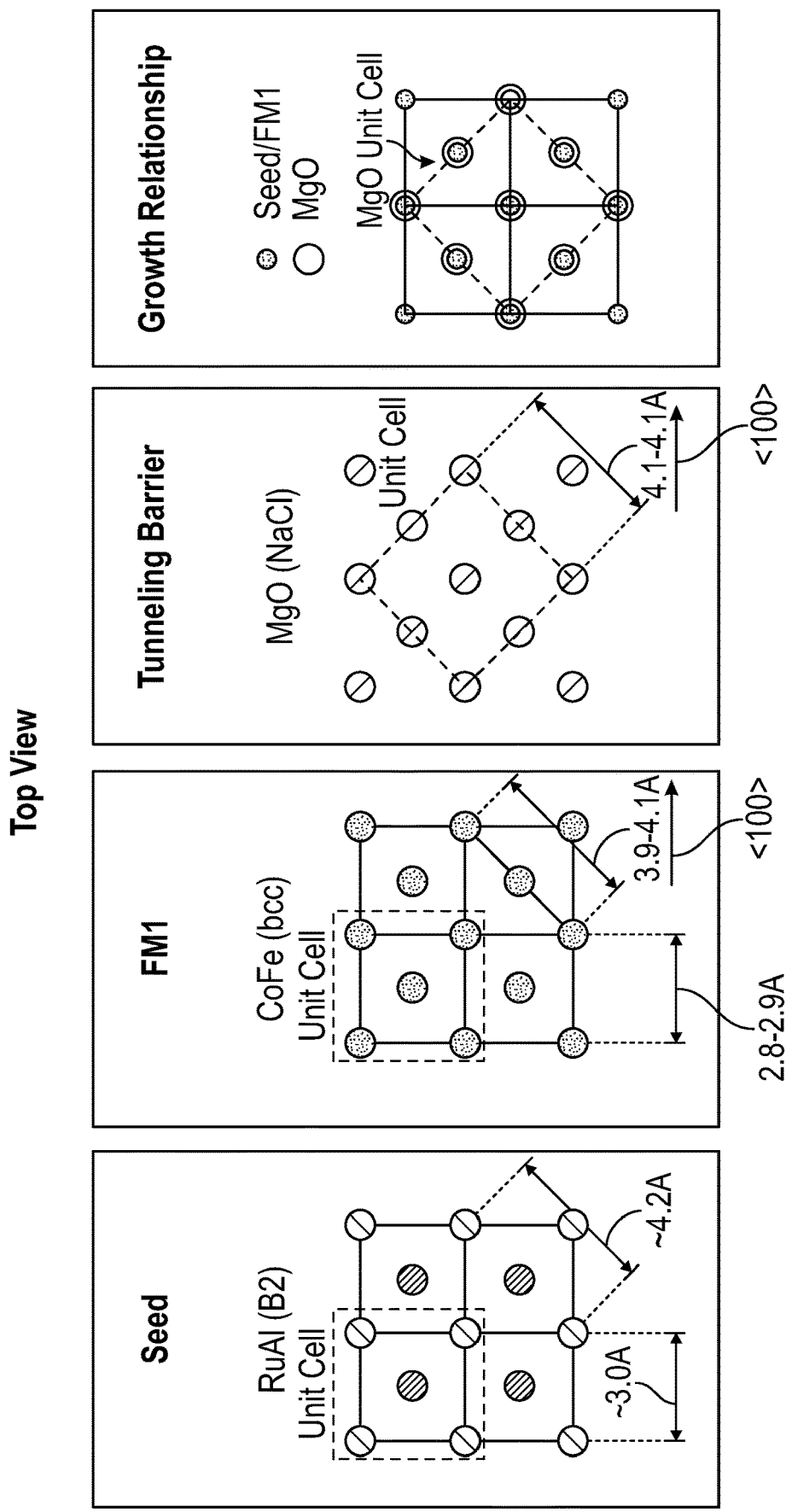
FIG. 6B is a schematic top view of the (001) planes of the RuAl (seed), CoFe (FM1) and MgO (tunneling barrier) layers and shows the NaCl structure of the MgO layer with its (001) plane grown at a 45 degree angle on the CoFe layer.

FIG. 5 is a schematic cross-sectional view of a FM1-layer/MgO/FM2-layer structure according to an embodiment of the invention with boron-free ferromagnetic layers and an improved seed layer. Each of the FM1 and FM2 layers may be single layer or a multilayer. FM1 is shown with an optional Co (or CoFe) nanolayer adjacent the MgO interface. An electrically conductive amorphous pre-seed layer is deposited directly on a lead layer formed on a suitable substrate. The pre-seed layer may be layer or multilayer comprising a material selected from a NiFeTa alloy, a CoFeTa alloy, a CoFeB alloy, a CoFeBTa alloy and Ta, with a total thickness in the range of about 5 to 50 Å. The electrically conductive seed layer, which is preferably a RuAl alloy (or alternatively a CrMo alloy) is deposited directly on the pre-seed layer and forms either as a B2 crystalline structure (also called a CsCl structure) in the case of RuAl or a BCC phase in the case of CrMo (Mo between about 30-50 atomic percent) with (001) texture, i.e., the (001) plane is parallel to the surfaces of the pre-seed layer and the substrate. The RuAl seed layer has a thickness in the range of about 5 to 50 Å and a preferred composition of $Ru_xAl_{(100-x)}$, where x is in atomic percent and is greater than or equal to 45 and less than or equal to 60. The boron-free FM1 layer, which is preferably a CoFe alloy, is deposited on the seed layer, grows in the <001> direction and inherits the (001) texture. An optional BCC sublayer (not shown in FIG. 5), like Cr, can be deposited on the seed layer prior to the deposition of the FM1 layer, in which case the FM1 layer is deposited directly on the sublayer. (As used herein, the phrase "on a layer" means there can be an intermediate layer or layers between an upper and lower layer, while the phrase "directly on a layer" means the upper layer is directly on and in contact with the lower layer). The boron-free FM1 layer has a typical thickness in the range of 20 to 80 Å and can also be a multilayer, as shown in FIG. 5. While a CoFe alloy is the preferred material for FM1, other suitable materials with BCC structures that can inherit the (001) texture of the seed layer include a CoFeNi-based alloy, Heusler alloys like $Co_2MnSi$, $Co_2MnAl$, $Co_2MnGe$, $Co_2FeSi$ and $Co_2FeAl$, and half-Heusler alloys like NiMnSb. The MgO barrier layer is then deposited directly on the CoFe layer, or alternatively directly on the optional Co nanolayer (2 to 20 Å), to a thickness in the range of about 4 to 20 Å. The MgO barrier layer grows epitaxially with the 001 texture on the FM1 layer. While MgO is preferred, other materials that can function as tunneling barrier layers and inherit the (001) texture of the FM1 layer include ZnO, MnO, CoO, TiO and VO, as well as spinel materials like $MgAl_2O_4$ and $MgGa_2O_4$. FIG. 6A is a schematic of a side view showing the <001> growth direction of the FM1 and tunneling barrier layer with (001) texture on RuAl seed layer. FIG. 6B is a schematic top view of the (001) planes of the RuAl (seed), CoFe (FM1) and MgO (tunneling barrier) layers and shows that the (001) plane of the NaCl structure of the MgO layer is at a 45 degree angle on the CoFe layer.

The FM2 layer is then deposited on the MgO barrier layer. While the FM2 layer is also preferably a boron-free layer and preferably a CoFe alloy, it may contain B for soft magnetic properties or for lower magnetostriction. The FM2 layer can be a BCC structure or a multilayer that includes amorphous or FCC layers, provided the layer at the MgO interface has a BCC structure. After deposition of the layers in the stack, the stack is annealed, preferably at about 180 to 280° C. for 2 to 5 hours. This improves the crystallinity of the FM1 and FM2 layers and the barrier layer by reducing strain. Unlike the prior art there is no boron diffusion into the barrier layer. Also, defects in the crystalline structure of the barrier layer, which is typically MgO, are at the grain boundaries, but because the grains in the barrier layer in various embodiments of this invention are larger than the grains of the barrier layer formed on the CoFeB layer of the prior art, there are fewer defects in the barrier layer after annealing. A nonmagnetic cap layer, like a Ru/Ta/Ru multilayer, may be formed on FM2.

Figure 7:
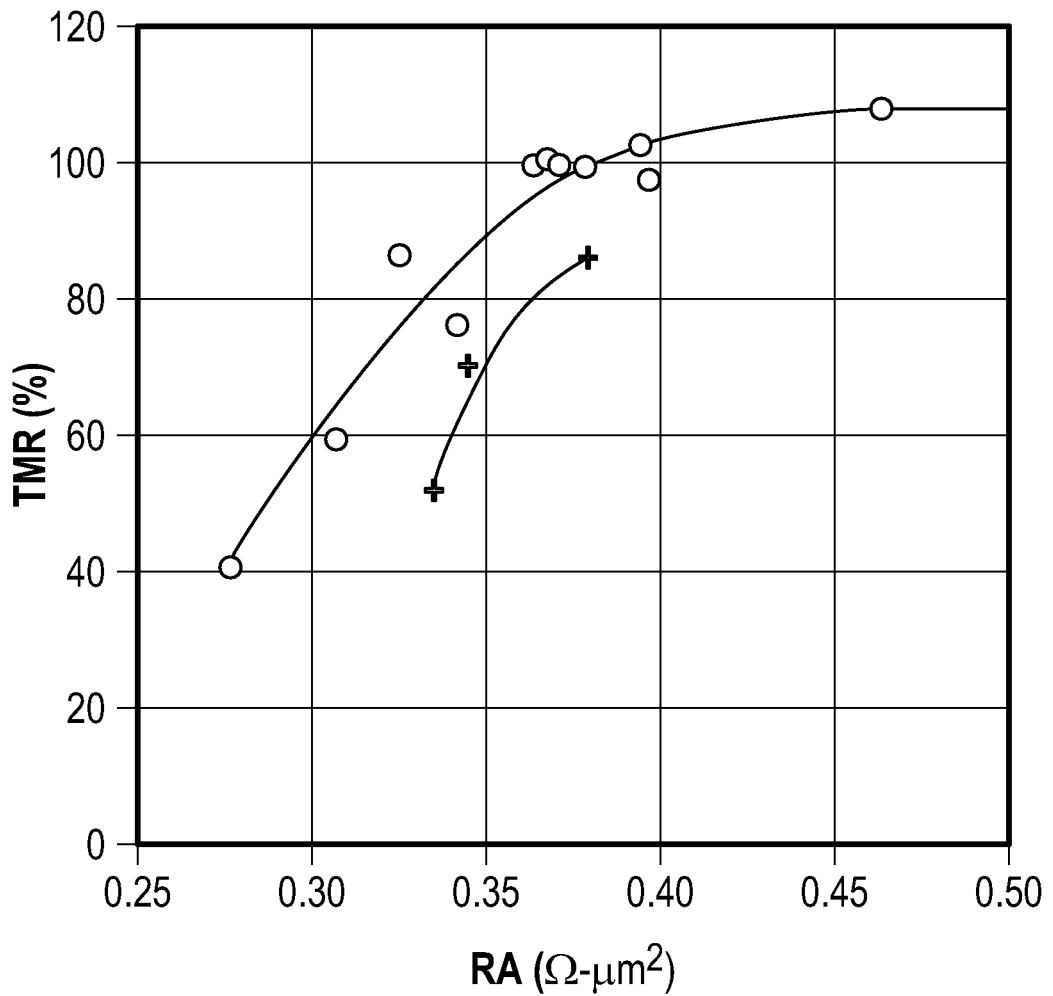
FIG. 7 is a graph of measured TMR vs. resistance-area product (RA) for a prior art dual free layer (DFL) device and a DFL device according to an embodiment of the invention.

FIG. 7 is a graph of measured TMR vs. RA for a prior art DFL wafer (like in FIG. 4) and a DFL wafer according to an embodiment of the invention (like in FIG. 5). The TMR ratio is given by $\Delta R/R = (R_{AP} - R_P)/R_P$, where $R_P$ and $R_{AP}$ represent the resistance measured for parallel and antiparallel configurations of the ferromagnetic layer magnetizations. The prior art DFL wafer whose data is shown by the lower curve had a FM1 of a CoHf(20 Å)/CoFeB(50 Å)/Co(4 Å) multilayer and a FM2 of a CoFe(4 Å)/CoFeB(50 Å)/CoHf (20 Å) multilayer. The embodiment of the invention whose data is shown by the upper curve had a RuAl seed layer, a FM1 of a CoFe(50 Å)/Co(5 Å) multilayer and a FM2 of a CoFe(50 Å) layer. For an RA range of about 0.34 to 0.38 (Ohm-micron²) the embodiment of the invention has higher TMR between about 80-100%, compared to the prior art that has a range between about 50-85%. Similarly, for a TMR range of about 50-85%, the embodiment of the invention has lower RA between about 0.28 to 0.34 (Ohm-micron$^2$), compared to the prior art that has a range of about 0.34 to 0.38 (Ohm-micron$^2$).

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A tunneling magnetoresistive (TMR) device comprising:
   a substrate;
   a seed layer having a crystalline structure and a (001) texture on the substrate, wherein the seed layer is selected from a RuAl alloy and a CrMo alloy;
   a boron-free first ferromagnetic layer having a BCC crystalline structure and a (001) texture on the seed layer, the first ferromagnetic layer selected from a CoFe alloy, a Heusler alloy and a half-Heusler alloy;
   a tunneling barrier layer having a rock salt crystalline structure or spinel structure and a (001) texture on the first ferromagnetic layer; and
   a second ferromagnetic layer on the tunneling barrier layer.

2. The device of claim 1 wherein the tunneling barrier layer is selected from MgO, ZnO, MnO, CoO, TiO, VO, MgAl$_2$O$_4$ and MgGa$_2$O$_4$.

3. The device of claim 1 further comprising an amorphous pre-seed layer between the substrate and the seed layer.

4. The device of claim 3 wherein the pre-seed layer is a layer or multilayer comprising a material selected from a NiFeTa alloy, a CoFeTa alloy, a CoFeB alloy, a CoFeBTa alloy and Ta.

5. The device of claim 1 wherein the first ferromagnetic layer comprises a nanolayer selected from Co and a CoFe alloy.

6. The device of claim 1 where the second ferromagnetic layer is a boron-free ferromagnetic layer.

7. The device of claim 1 wherein the first ferromagnetic layer comprises a CoFeNi-based alloy, Co$_2$MnAl, Co$_2$MnGe, Co$_2$FeSi, Co$_2$FeAl, or NiMnSb.

8. The device of claim 1 wherein the seed layer has a thickness of about 5 Å to about 50 Å.

9. The device of claim 1 wherein the first ferromagnetic layer has a thickness of about 20 Å to about 80 Å.

10. The device of claim 1 wherein the tunneling barrier layer has a thickness of about 4 Å to about 20 Å.

11. The device of claim 1 wherein, when the seed layer comprises the CrMo alloy, an atomic percent of Mo is about 30 to about 50.

12. The device of claim 1 wherein, when the seed layer comprises the RuAl alloy, an atomic percent of Ru is about 40 to about 65.

13. A tunneling magnetoresistive (TMR) device comprising:
    a substrate;
    an amorphous pre-seed layer on the substrate;
    a seed layer selected from a RuAl alloy and a CrMo alloy and having a crystalline structure and a (001) texture on the pre-seed layer;
    a boron-free alloy comprising Co and Fe first ferromagnetic layer having a BCC crystalline structure and a (001) texture on the seed layer;
    a tunneling barrier layer consisting essentially of MgO on the first ferromagnetic layer; and
    a second ferromagnetic layer on the tunneling barrier layer.

14. The device of claim 13 wherein the pre-seed layer is a layer or multilayer comprising a material selected from a NiFeTa alloy, a CoFeTa alloy, a CoFeB alloy, a CoFeBTa alloy and Ta.

15. The device of claim 13 wherein the seed layer consists essentially Ru$_x$Al$_{(100-x)}$ where x is in atomic percent and is greater than or equal to 45 and less than or equal to 60.

16. The device of claim 13 wherein the first ferromagnetic layer comprises a nanolayer selected from Co and a CoFe alloy adjacent the tunneling barrier layer and the second ferromagnetic layer comprises a nanolayer selected from Co and a CoFe alloy adjacent the tunneling barrier layer.

17. The device of claim 13 where the second ferromagnetic layer is a boron-free ferromagnetic layer.

18. The device of claim 13 wherein the seed layer has a thickness of about 5 Å to about 50 Å.

19. The device of claim 13 wherein the first ferromagnetic layer has a thickness of about 20 Å to about 80 Å.

20. The device of claim 13 wherein the tunneling barrier layer has a thickness of about 4 Å to about 20 Å.

21. The device of claim 13 wherein, when the seed layer comprises the CrMo alloy, an atomic percent of Mo is about 30 to about 50.

* * * * *